(12) United States Patent
Atherton

(10) Patent No.: US 10,725,074 B2
(45) Date of Patent: Jul. 28, 2020

(54) VOLTAGE INDICATOR FOR POWER CORD

(71) Applicant: John Atherton, Beaverton, OR (US)

(72) Inventor: John Atherton, Beaverton, OR (US)

( * ) Notice: Subject to any disclaimer, the term of this patent is extended or adjusted under 35 U.S.C. 154(b) by 75 days.

(21) Appl. No.: 16/171,084

(22) Filed: Oct. 25, 2018

(65) Prior Publication Data

US 2020/0132733 A1    Apr. 30, 2020

(51) Int. Cl.
*G01R 19/155* (2006.01)
(52) U.S. Cl.
CPC .................................. *G01R 19/155* (2013.01)
(58) Field of Classification Search
CPC ............ G01R 31/2894; G01R 31/2853; G11C 29/022; G11C 29/816
USPC ................... 324/71.11, 73.1, 76.11
See application file for complete search history.

(56) References Cited

U.S. PATENT DOCUMENTS

| | | |
|---|---|---|
| 2,449,150 A | 9/1948 | Schnoll |
| 3,753,261 A | 8/1973 | Thaxton |
| 4,520,239 A | 5/1985 | Schwartz |
| 4,671,597 A | 6/1987 | Grill |
| 4,829,289 A | 5/1989 | Kallman et al. |
| 5,070,301 A | 12/1991 | Schweitzer, Jr. |
| 5,077,520 A | 12/1991 | Schweitzer, Jr. |
| 5,095,265 A | 3/1992 | Schweitzer, Jr. |
| 5,363,088 A | 11/1994 | Schweitzer, Jr. |
| 5,424,630 A | 6/1995 | Vazquez |
| 6,157,184 A | 12/2000 | Ahterton |
| 7,893,686 B1 | 2/2011 | Atherton |
| 8,058,879 B1 | 11/2011 | Atherton |
| 2017/0060150 A1* | 3/2017 | Stefanski ............... G05D 23/27 |
| 2018/0036740 A1* | 2/2018 | Nelson .................... B02C 19/18 |
| 2018/0059176 A1* | 3/2018 | Ding .................... G01R 1/0433 |

FOREIGN PATENT DOCUMENTS

| | | |
|---|---|---|
| CA | 474305 A | 6/1951 |
| CA | 728300 A | 2/1966 |
| CA | 993952 A | 7/1976 |
| CH | 221666 A | 8/1942 |

* cited by examiner

*Primary Examiner* — Giovanni Astacio-Oquendo
(74) *Attorney, Agent, or Firm* — Chernoff Vilhauer LLP

(57) ABSTRACT

A voltage indicator and a method for its use in detecting and indicating the presence of single-phase AC voltage in an electrical power cord. The voltage indicator includes an electronic display, capacitor plate elements connected electrically to the electronic display so as to couple the voltage indicator capacitively to the electrical power cord when alternating current voltage is present, and diodes that act as a rectifier, between one of the capacitor plate elements and the electronic display device. Capacitive coupling develops electrical current through the voltage indicator and energizes the display device when alternating line current voltage is present in the power cord. The voltage indicator is electrically insulated from the power cord it monitors by the usual insulation on the power cord or cable.

9 Claims, 7 Drawing Sheets

VOLTAGE INDICATOR FOR POWER CORD

BACKGROUND OF INVENTION

The present invention relates to apparatus and a method for determining whether line voltage is present in an alternating current power cord, and in particular to such a sensor that can be mounted on a power cord at any point along its length and which provides an easily viewed indication of whether alternating voltage is present in the power cord.

Consumers of electric power have long been inconvenienced with the problem of determining whether there is electric power going to an appliance or device that they are about to use. Traditionally they just switch on the appliance or device to see if it works. However, not all appliances can be determined to have a supply of electrical power at the moment the power switch is turned on.

Examples of this are coffee makers, soldering irons, and clothes irons that don't have visual power indicators. The voltage indicator described in the present disclosure provides a clear and almost instantaneous indication of whether power is available.

Various devices have been available previously for determining and indicating whether voltage is available in power cables and extension cords, but most have not been particularly satisfactory.

For example, U.S. Pat. No. 5,424,630 to Vazquez (1995) discloses a voltage indicator that has a knife blade as one electrical contact and an alligator clip as the other electrical contact of the voltage indicator. Two disadvantages of this indicator are readily apparent. The knife blade contact is used to cut through the insulation on the wire, thus permanently damaging it, and the alligator clip needs a grounded electrical terminal to be clipped on to complete the circuit.

U.S. Pat. No. 5,428,288 to Foreman et al. (1995) and U.S. Pat. No. 2,449,150 to Schnoll (1948) are for related indicators. In both of these patents a thin electrical connecting wafer is slid over the end of a standard male electric power plug. A common disadvantage of both of these inventions is that the thin wafer decreases the quality of the electrical connection of the male plug to the power outlet. The Foreman et al. patent also requires the use of a computer to sense a power failure while in the Schnoll patent the indicator can only be read at the male plug and not at anywhere along the length of the power cord as might be more convenient.

U.S. Pat. No. 4,829,289 to Kallman et al. (1989) and Canadian Patent No. 728,300 to Windsor (1966) are for related voltage indicators. The patents disclose an illuminated plug that can be installed between a normal power outlet and the male plug at the end of the power cord. Both of these devices have the disadvantage of being impractical for use at a power receptacle behind a piece of furniture. The device described in the Windsor patent has the additional disadvantage that an appliance or device connected through the device needs to be turned on to complete a path through the illuminated indicator in order for the device to provide a useful indication.

Swiss Patent No. 221,666 to Gerber (1942) and Canadian Patent No. 474,305 to Simmons (1951) disclose similar voltage indicators. Both patents disclose screwdriver or pen type voltage indicators that use a return path to ground through a human being. Both devices have the disadvantage of needing to make physical contact between a probe tip and a conductor of a power cord being considered.

Atherton U.S. Pat. No. 7,893,686 (2011) discloses a voltage indicator for use with an ordinary single-phase AC power cord of either the grounded or the ungrounded type, in which capacitive coupling takes place between an energized conductor of the power cord and a first terminal of an electronic display. A circuit for the electronic display is completed by a human touching a conductive element of the device, in response to which the display indicates whether voltage is present in the power cord.

Canadian Patent No. 993,952 to Friesen (1976) discloses a power cord voltage indicator in which metallic contacts pierce the conductors of the power cord under test. The piercing of the power cord conductors has the disadvantage of doing permanent damage to the power cord insulation as well as the disadvantage of being unusable on power cords that are completely enclosed in a protective outer sheath.

U.S. Pat. No. 5,095,265 to Schweitzer Jr. (1992) is for a coaxial power cord voltage indicator in which capacitive sensor must pass through the outer conductive jacket of the coaxial cable in order to be operative. The patent is limited to use only in coaxial cables in which an outer sheath is electrically conductive and can act to provide a ground return path.

Other patents to Schweitzer Jr. for related devices are U.S. Pat. No. 5,070,301 (1991), U.S. Pat. No. 5,077,520 (1991), and U.S. Pat. No. 5,363,088 (1994). These voltage indicators, however, are all intended for sensing voltage in coaxial cables with a ground return on an outer coaxial conductor.

U.S. Pat. No. 6,157,184 (2000) to Atherton discloses a voltage indicator for similar application.

What is desired, then, is a device that can be applied simply to a conventional alternating current power cord, at any chosen position along the power cord, and a method for sensing and providing a visible indication of whether ordinary alternating current voltage is present in the power cord. Such a device should not physically damage the power cord on which it is mounted, should not require any power source, such as a battery, of its own, and should require only a minimal amount of power, obtained from the power cord being observed.

SUMMARY OF THE INVENTION

The present disclosure provides an answer to some of the needs and desires mentioned above, in a sensing device for determining and indicating whether ordinary line AC voltage is present in a power cord, and a method of use of such a device, as defined by the claims which form a part of this disclosure.

In accordance with a first aspect of the present disclosure an alternating current voltage sensor and display device can be mounted on a conventional electrical power cord.

In one embodiment of the device there is a flexible base in the form of, for example, a small sheet of an electrically insulating material that can be easily wrapped around a power cord.

In one embodiment of the device disclosed herein electronic circuit components are mounted on a first, or outer, main side of the flexible base, and the flexible base has an opposite, second, or inner, main side, on which electrically conductive elements are carried and act as capacitor plates to achieve capacitive coupling when alternating current voltage is present in a power cord on which the device is mounted.

In one embodiment of the device a releasable and reusable fastener is secured to the flexible base and may be used to keep the voltage sensor in place, with its flexible base wrapped around the power cord.

In one embodiment of the device there is an electronic display device connected electrically to receive a very small electrical current obtained parasitically through capacitive coupling of the voltage indicator with a power cord or cable when alternating voltage is present, in order to display the presence of alternating current voltage in the power cord or cable.

In accordance with another aspect, the present disclosure provides a method of determining the presence of an alternating current electrical voltage on a power cord or cable. The method, in one embodiment, comprises mounting an AC voltage indicator on the power cord or cable so as to couple the voltage indicator capacitively with the conductors of the power cord or cable when alternating current voltage is present, thereby parasitically obtaining and providing an electrical current to an electronic display device that provides an indication that voltage is present in the energized power cord.

One embodiment of the method includes coupling the voltage indicator capacitively with an energized power cable or cord by wrapping a flexible base of the voltage indicator about the power cord. Capacitor plate elements carried on the flexible base are located close enough to the power cord for the changing electrical field surrounding the power cord to produce current in conductors connecting the capacitor plate elements with the electronic display device when the power cord or cable is energized with alternating current voltage. The electronic display device then indicates the presence of alternating current voltage in the power cord by a visible display.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION OF PREFERRED EMBODIMENTS

Figure 1:
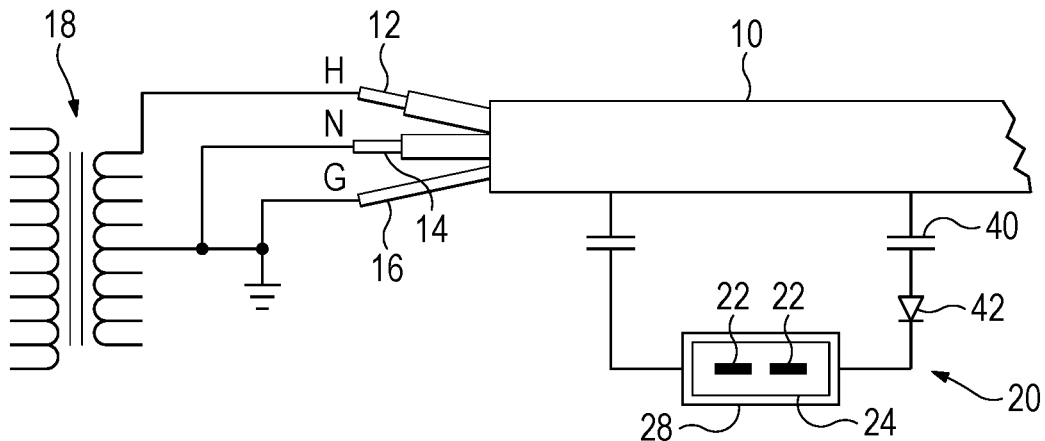
FIG. 1 is a simplified schematic diagram of a voltage indicator embodying the invention disclosed herein, shown associated with a grounded power cord.

Referring now to the drawings that form a part of the disclosure herein, in FIG. 1 a three-conductor power cord 10, including a hot conductor 12, a neutral conductor 14, and a grounded conductor 16, is shown schematically as being connected electrically to a conventional alternating current power source 18. A voltage indicator 20 is shown schematically as being connected to the power cord 10 by capacitive coupling, with a pair of bars 22 visible on a display element 24 to indicate that the power cord 10 is energized with alternating current voltage.

Figure 2:
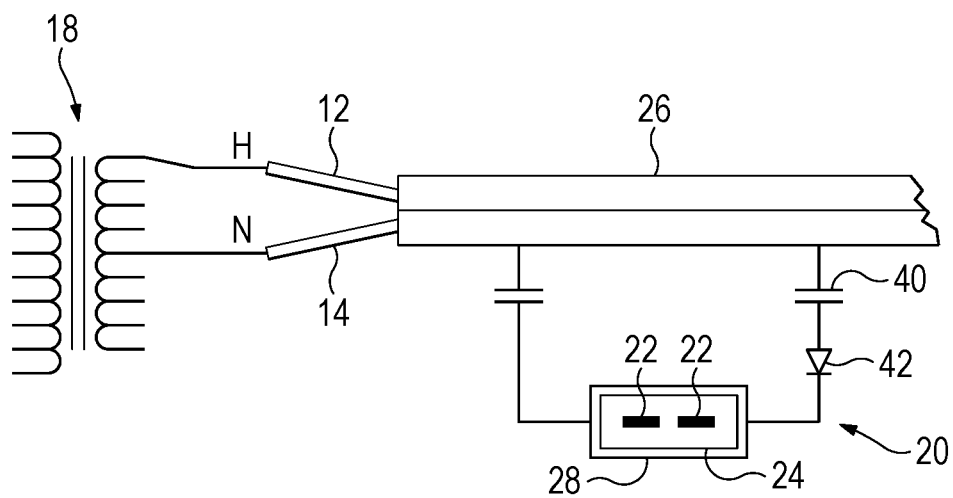
FIG. 2 is a simplified schematic diagram of the voltage indicator shown in FIG. 1, shown with an ungrounded power cord.

In FIG. 2 the voltage indicator 20 is shown schematically as being capacitively coupled to an energized conventional two-conductor power cord 26 having a hot conductor 12 and a neutral conductor 14, shown schematically as being connected to the conventional alternating current (AC) power source 18.

In both FIG. 1 and FIG. 2, the display element 24 incorporated in the voltage indicator 20 is indicating the presence of AC voltage by displaying the pair of bars 22. The electronic display element 24 requires only a very low amount of power that can be obtained parasitically from a power cord 10 or 26 through capacity coupling, and may be, for example, included in an LCD display device 28.

Figure 3A:
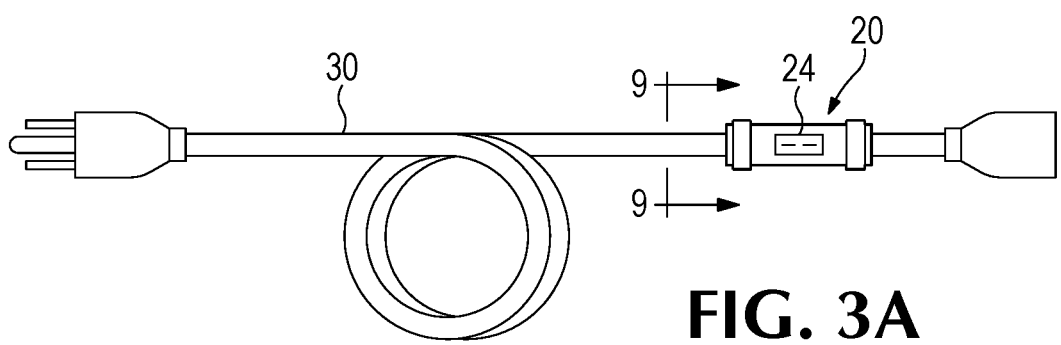
FIGS. 3A-3D show the voltage indicator in use in different likely applications.
Figure 3B:
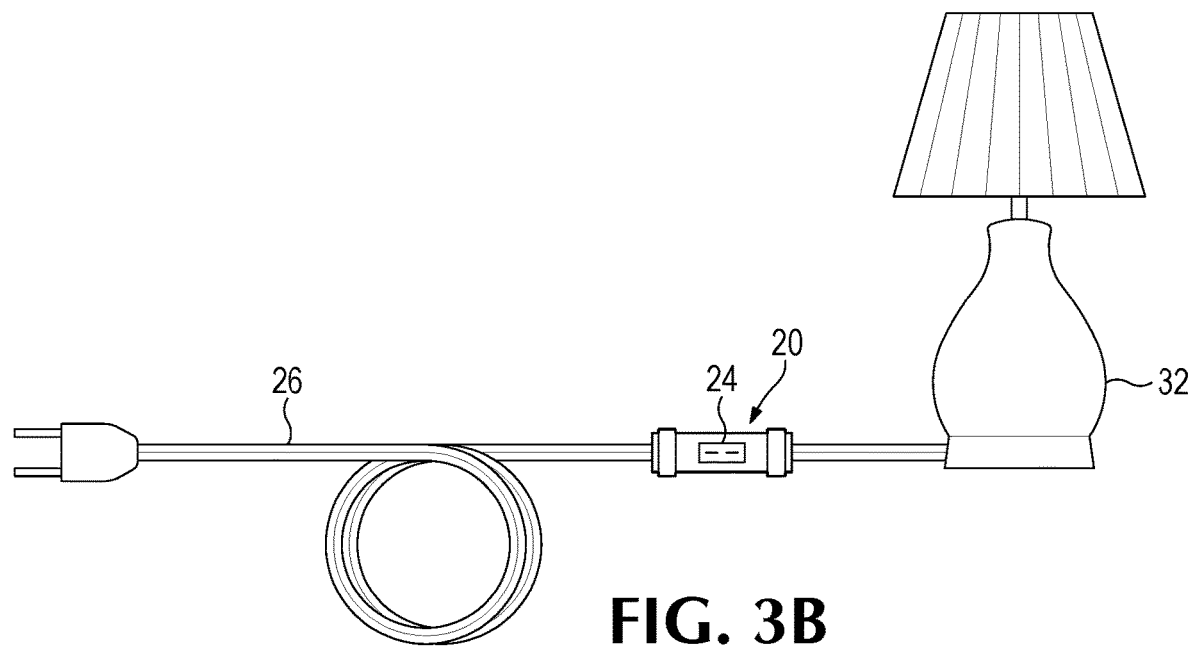
Figure 3C:
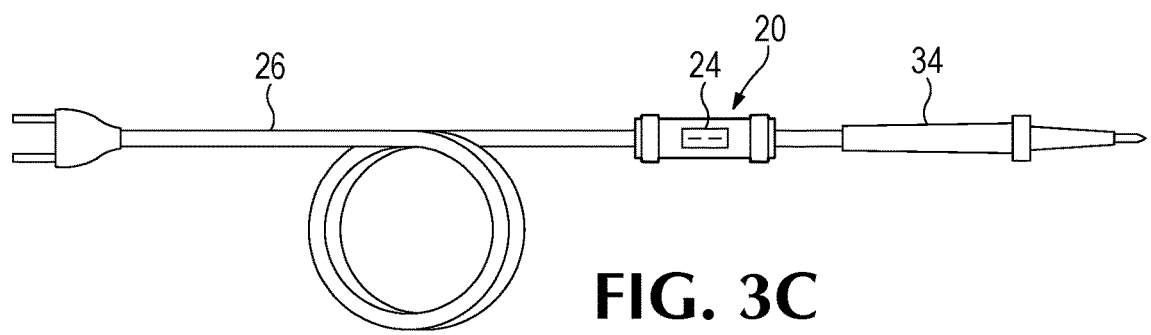
Figure 3D:
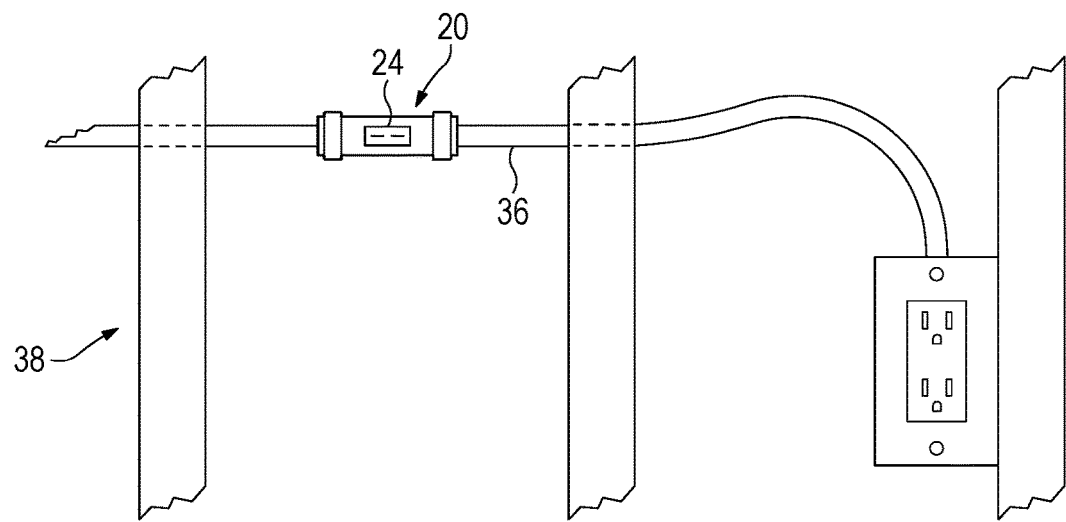

In FIGS. 3A, 3B, 3C, and 3D, the voltage indicator 20 is shown in simplified pictorial views, mounted on cords of various appliances, and on a power cable. In FIG. 3A the voltage indicator 20 is shown mounted on a three-conductor extension cord 30. In FIG. 3B the voltage indicator 20 is shown mounted on a conventional two-conductor power cord 26 for a lamp 32. In FIG. 3C the voltage indicator 20 is shown mounted on the two-conductor power cord 26 of a soldering iron 34. In FIG. 3D the voltage indicator 20 is shown mounted on a grounded three-conductor power cable 36 within a building wall 38, illustrated without the usual covering of wallboard or paneling.

In FIG. 4 A, the voltage indicator 20 is shown schematically, together with a three-conductor power cord 10. Capacitive coupling is shown, between the power cord 10 and capacitor plates 40. Each capacitor plate 40 is associated with a respective one of a group of at least four solid state diodes 42 all oriented in the same direction and connected to a first display device terminal 46 of the display device of the voltage indicator 20. The display element of the voltage indicator 20 may be a liquid crystal display, operable with low voltage power.

A respective capacitor plate 40 is shown connected to each of at least four diodes 42, all of which are connected to a display device input conductor 44 connected to the first display input electrode 46. The capacitor plates 40 are shown in proximity to the power cord 10, so that changing magnetic fields resulting from alternating voltages in the power cord 10 surround and can influence the capacitor plates 40. The number of the diodes 42 is not critical, but there must be sufficient total capacitance to provide enough power through the conductor 44 to operate the LCD display device 28 when the voltage indicator 20 is coupled capacitively to the power cord 10.

A flexible base, or first, capacitor plate 52, also in proximity to the power cord 10, is shown connected through a conductor 54 to the second display input electrode 56 and is also within the electromagnetic field surround ing the power cord 10 when it is energized.

Figure 4A:
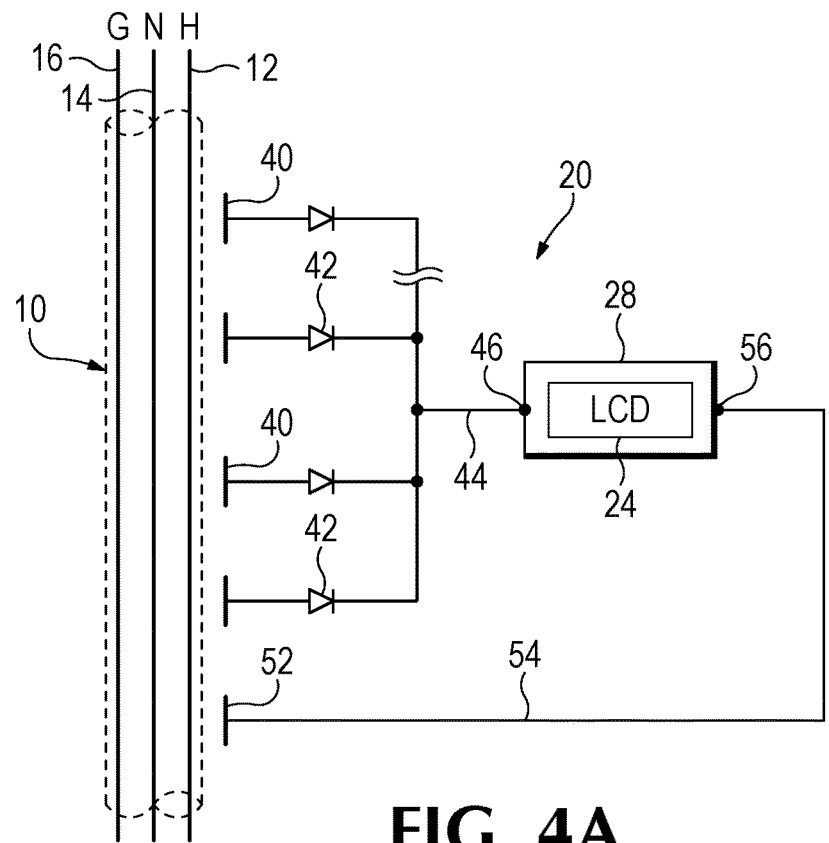
FIG. 4A is a circuit diagram of a first embodiment of the voltage indicator in use with a grounded power cord.
Figure 4B:
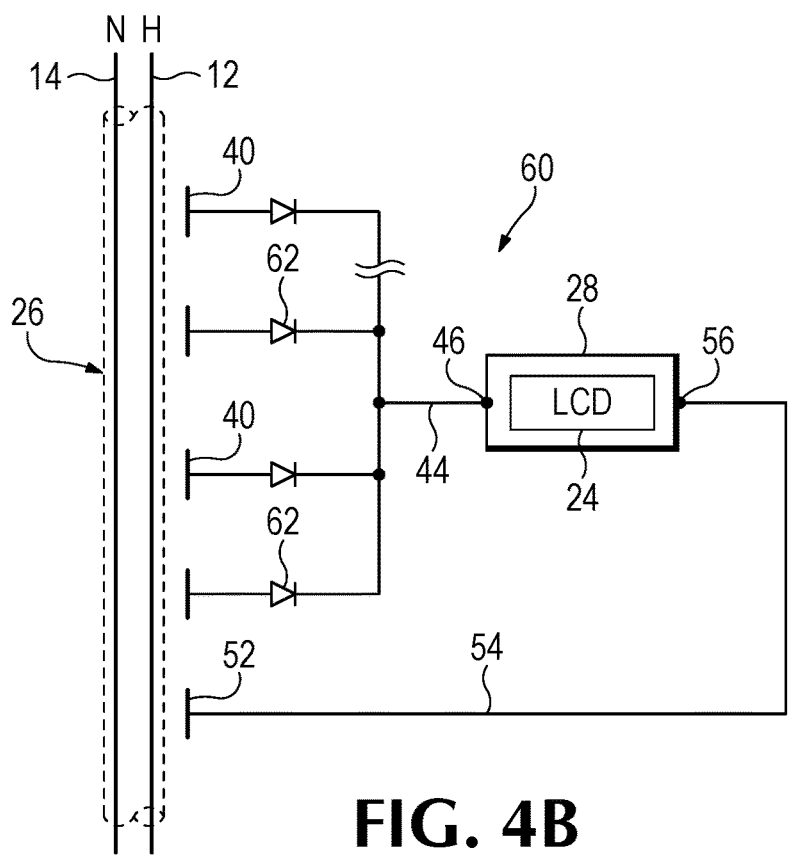
FIG. 4B is a circuit diagram of a second embodiment of the voltage indicator in use with an ungrounded power cord.

Referring also to FIG. 4B, a voltage indicator 60, shown schematically together with a two-conductor power cord 26, is in most respects similar to the voltage indicator 20 shown in FIG. 4A, but includes a set of diodes 62 included between the display device 24 and the capacitor plates 40 so that the polarity of the diodes is opposite that of the diodes 42 shown in FIG. 4A.

A plastic housing surrounding the display device may be provided to prevent inadvertent contact with the conductors connecting the capacitor plates to the display device.

With the voltage indicator 20 or 60 mounted on the power cord a clearly apparent symbol such as two dashes or bars 22 is displayed by the display element 24 when AC voltage is present in the power cord conductors.

The voltage indicator 28 in the display device may include a liquid crystal display (LCD) element 24 such as a LUMEX™ display available from State Drive Co., of Palatine, Ill., which requires only 1.0 volt at 50 to 60 Hz and requires a current of only one microampere. As explained below, that amount of power can be obtained parasitically by capacitive coupling from a power cord 10 or 26 that is energized with normal 115 volt or 230 volt line alternating current voltage. The face of the liquid crystal display (LCD) 24 could have two dashes or bars 22 on it or another symbol such as a "lightning bolt with an arrow head" symbol on it.

Figure 5:
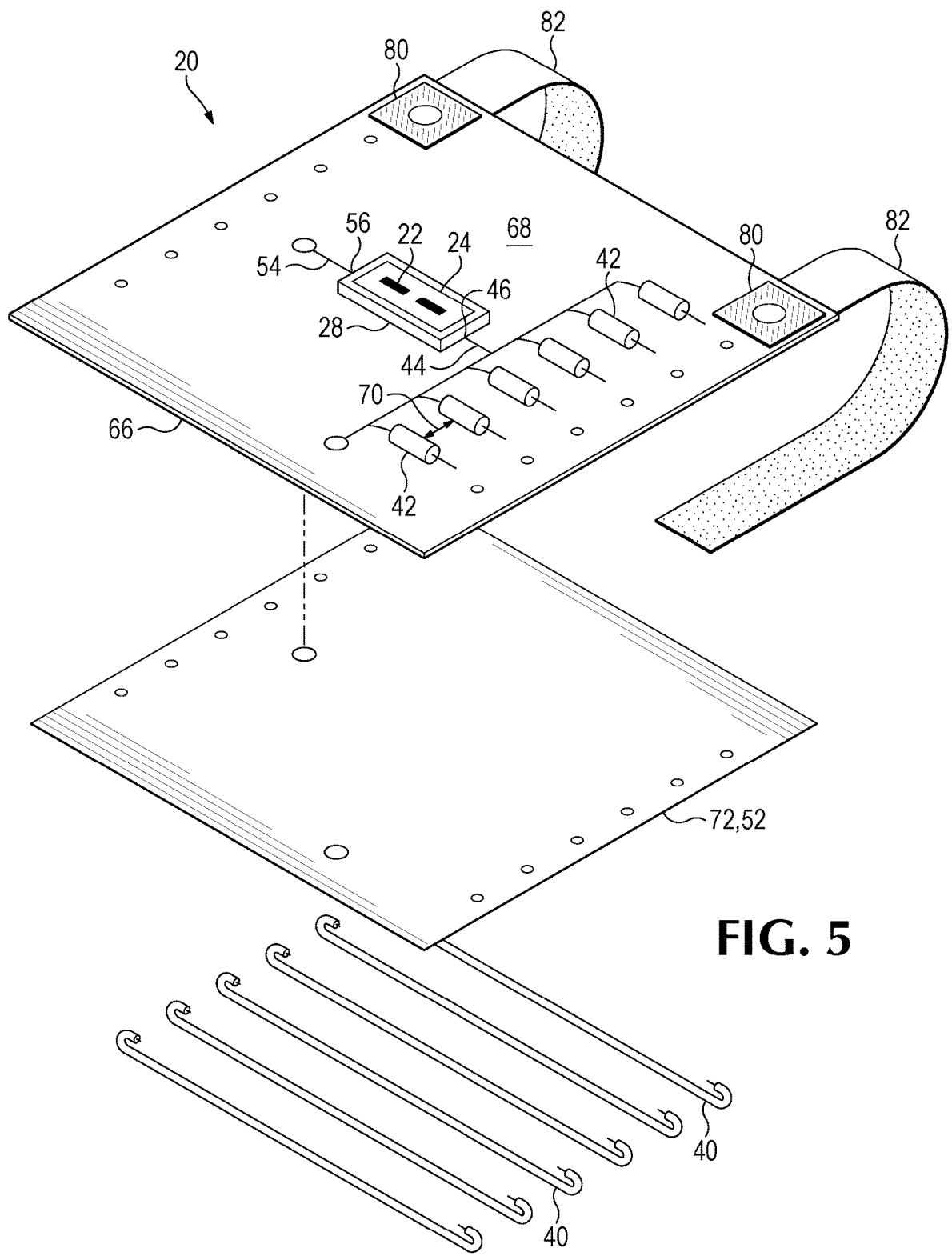
FIG. 5 is an exploded isometric view of one embodiment of the voltage indicator, at an enlarged scale.

Referring to FIG. 5, the voltage indicator 20 is shown in an exploded view A flexible base member 66 may be of thin, flexible sheet material of a nonconductive nature, such as a strong Nylon cloth. The flexible base member 66 thus has two opposite main faces or sides. On a first, or outer side 68, the display device 28 is mounted. As shown in FIG. 5, the display device may be a small package including the LCD display element 24, and may be attached to the flexible base member 66 by, for example, an adhesive. The diodes 42 or 62 may be physically small semiconductor germanium diodes, and are also mounted on the first, or outer, side 68 of the flexible base member 66. The diodes 42 are spaced apart from one another by a small distance 70, such as about 1 cm, and are preferably aligned physically parallel, as well as being connected with each other electrically in parallel through flexible insulated conductors. That is, they are connected with each other so that the forward direction, or negative terminal, of all of the diodes 2 is either toward the display device 28, as shown in FIG. 4A or so that the forward direction of all of the diodes 62 is away from the display device 28, as shown in FIG. 48. As shown in FIG. 4A, then, the forward, or negative, terminal of each of the diodes 42 is electrically connected to the first display input electrode 46.

A flexible sheet 72 of electrically conductive material is attached to the second, or inner, side 74 of the flexible base member 66 and serves functionally as the base capacitor plate 52. For example, the flexible electrically conductive sheet 72 of material may be a thin electrically conductive rip-stop cloth available from suppliers such as the 3M Company of St, Paul, Minn., and the flexible electrically conductive sheet 72 may be attached to the flexible base 66 by, for example, a flexible adhesive, or by nonconductive mechanical fasteners (not shown). A suitable conductor 54 leads from the second display input terminal of the display device 28 through the flexible base member 66 and is connected electrically to the flexible electric ally conductive sheet 72 of material.

The positive terminal of each of the diodes 42, at the end that is distal to the display device 28, is connected electrically to a separate conductor such as a small insulated wire that functionally acts as the respective capacitor plate 40, with each such small wire having a capacitance of a few pico farads, for example.

Figure 6A:
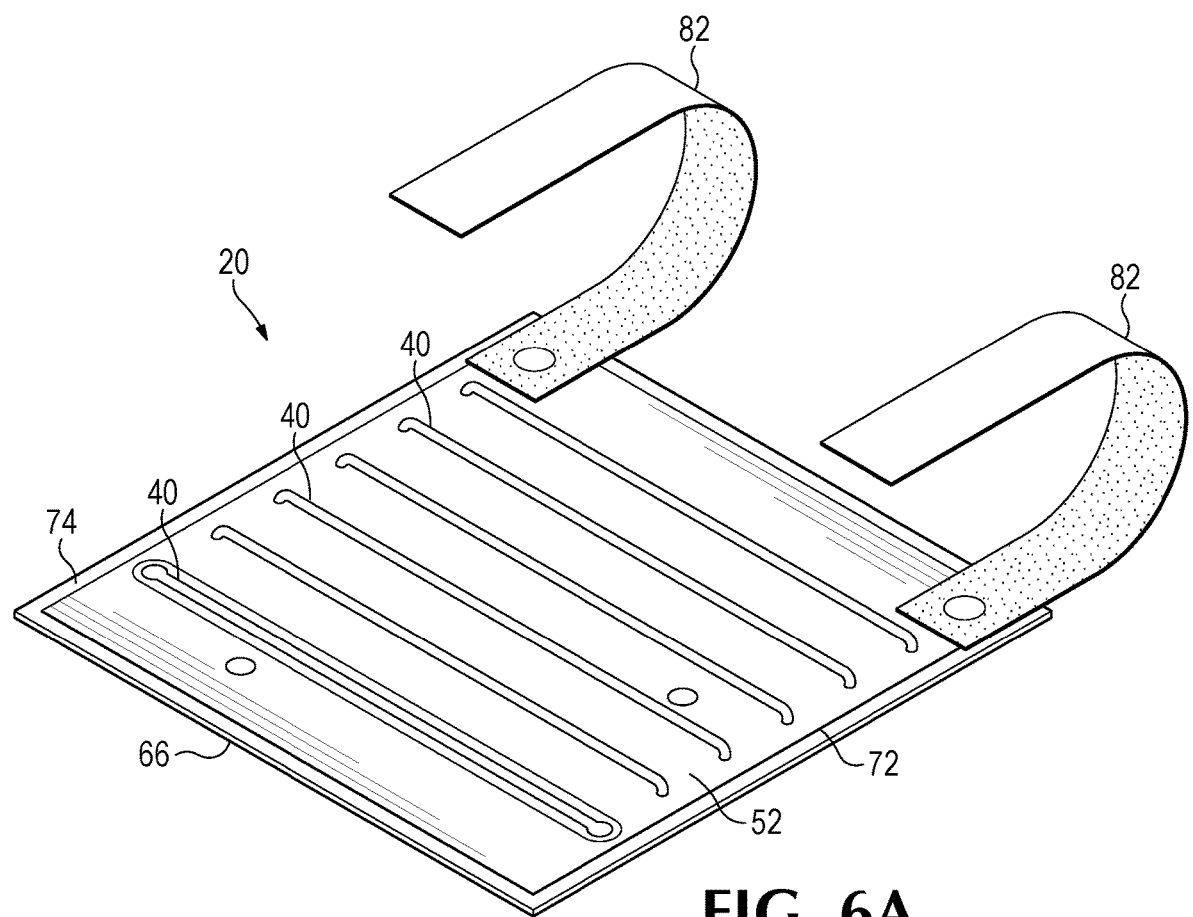
FIG. 6A is an isometric view of a back, or inner, side of the voltage indicator shown in FIG. 5.

Each of the small wire capacitor plates 40 extends from a respective one of the diodes 42, through a respective hole in the flexible base member 66, and may extend through a respective hole in the flexible conductive sheet 72 or around a margin of the flexible conductive sheet 72, and thence is positioned to lie along the flexible conductive sheet material 72 or the second, or inner side of the flexible base member 66, as shown in FIG. 6A. The small wires or capacitor plates 40 extend on the inner side 74 of the flexible base 66, parallel with one another and preferably parallel with the longitudinal axes of the diodes 42 and the display device 28 on the outer side of the flexible base 66, to facilitate wrapping the voltage indicator around a power cord by bending the flexible base 66 about an axis parallel with the wires 40, as shown in FIGS. 7 and 8.

Figure 6B:
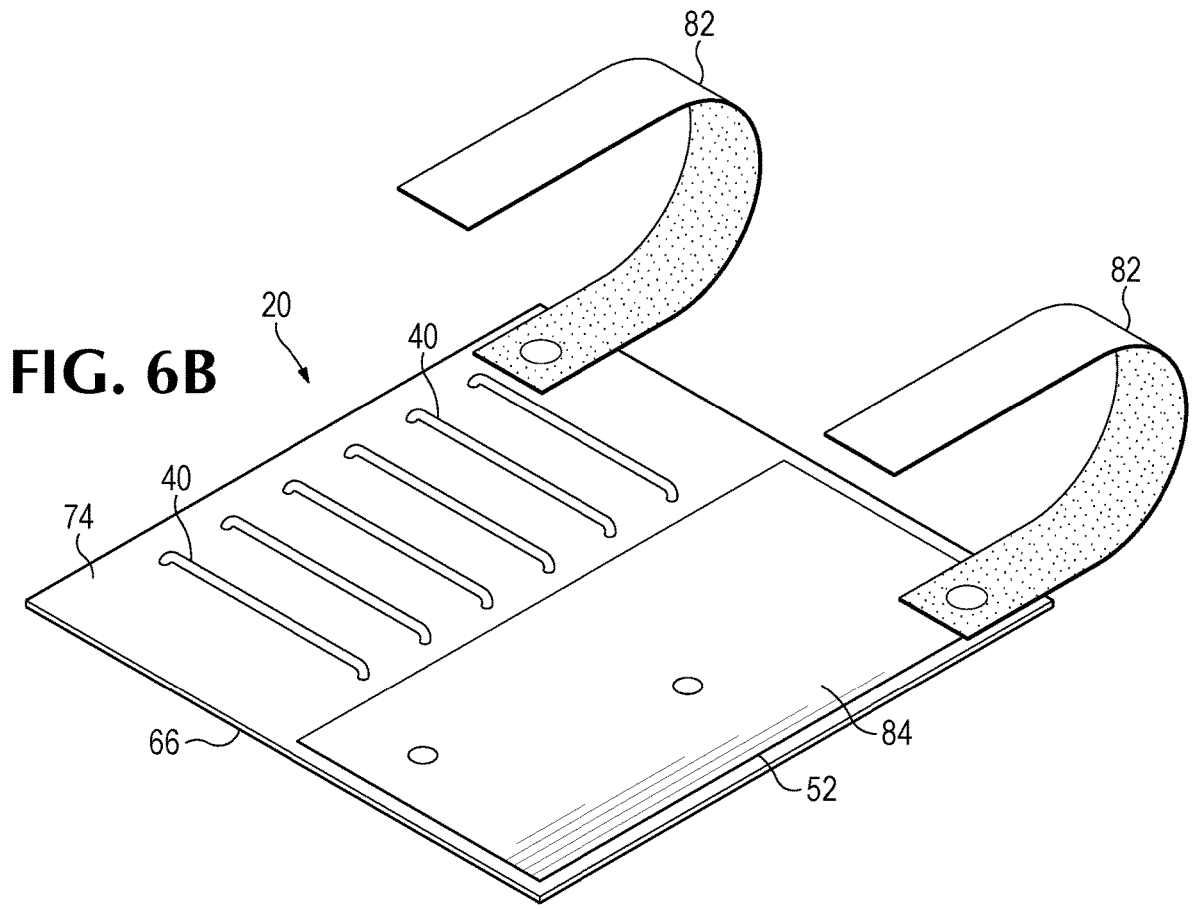
FIG. 6B is an isometric view of a back, or inner, side of another embodiment of the voltage indicator disclosed herein.
Figure 7:
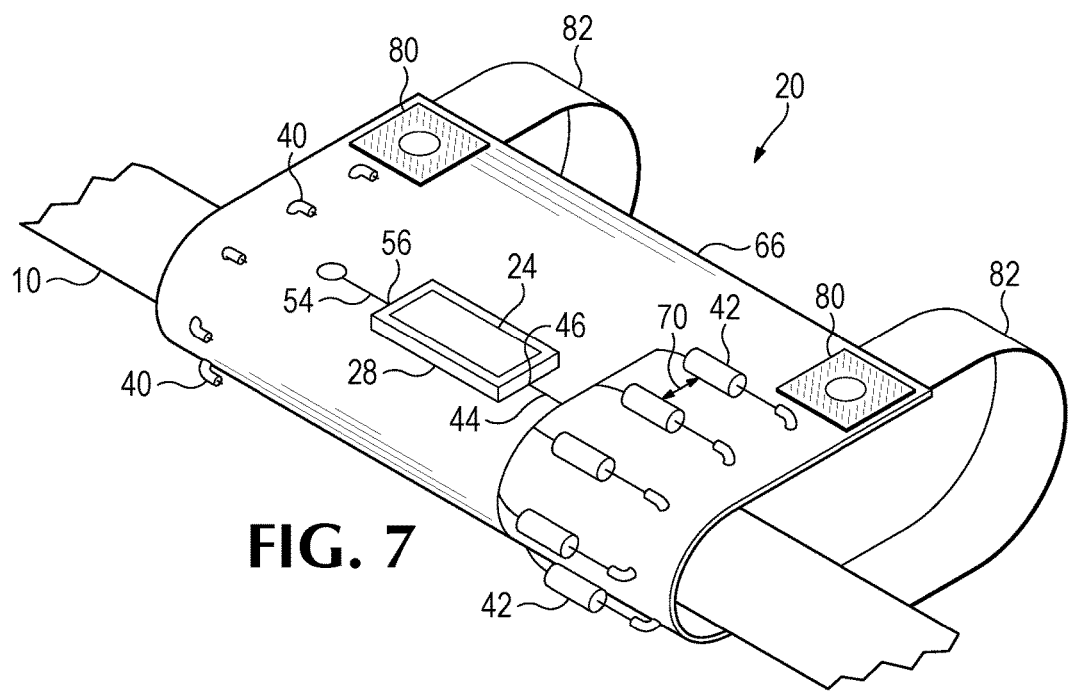
FIG. 7 is an isometric view, at an enlarged scale, showing one manner in which the voltage indicator can be wrapped around a power cord.
Figure 8:
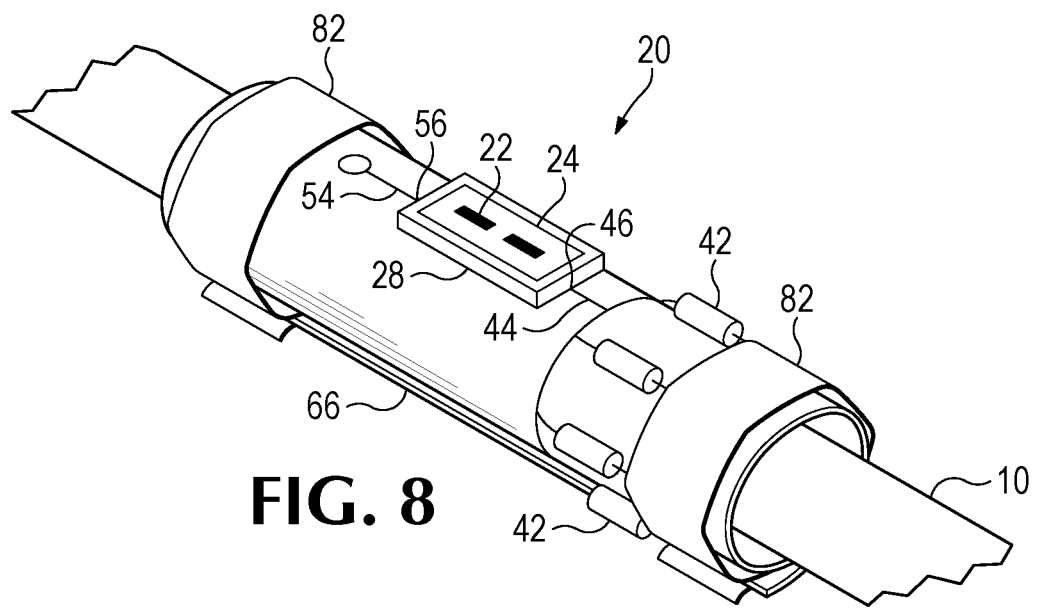
FIG. 8 is an isometric view, at an enlarged scale, showing the voltage indicator mounted and fastened in place on a power cord.

As shown in FIG. 5, a hook-and-loop fastener system is mounted on the flexible base to secure the voltage indicator 20 around a power cord 10 or 26, as seen in FIGS. 7 and 8. A small piece 80 of hook-bearing material, one part of a hook-and-loop fastener combination, is securely fastened to the first, or outer, side 68 of the flexible base member 66 at each of a pair of adjacent corners of the flexible base member 66, spaced apart in the direction of the longitudinal axes of the diodes 42 and display device 28. A pair of narrow strips 82 of the mating loop pile-bearing material of the hook-and-loop fastener combination are attached to the opposite, inner, side 74 of the flexible base member 66 and extend away from the flexible base member, as may be seen in FIGS. 5-7.

As shown in FIG. 63, a piece 84 of conductive cloth of the sort of which the sheet 72 is made, but that is much smaller than the flexible base member 66, may be attached to the second, or inner, sides 74 of the flexible base member 66, near the end of the display device 28 further from the array of diodes 42, and the small wire capacitor plates 40 may extend parallel with each other and be connected to the ends of the respective diodes 42 and extend over only the portion of the second, or inner, side of the flexible base member that is not covered by small piece 84 of the flexible conductive cloth, so that the wires functioning as capacitor plates 40, connected directly to the diodes 42, are physically separated by a small distance from the larger base capacitor plate 52 connected to the second display input electrode 56 of the display device 28, instead of lying along the base capacitor plate 52.

Figure 9:
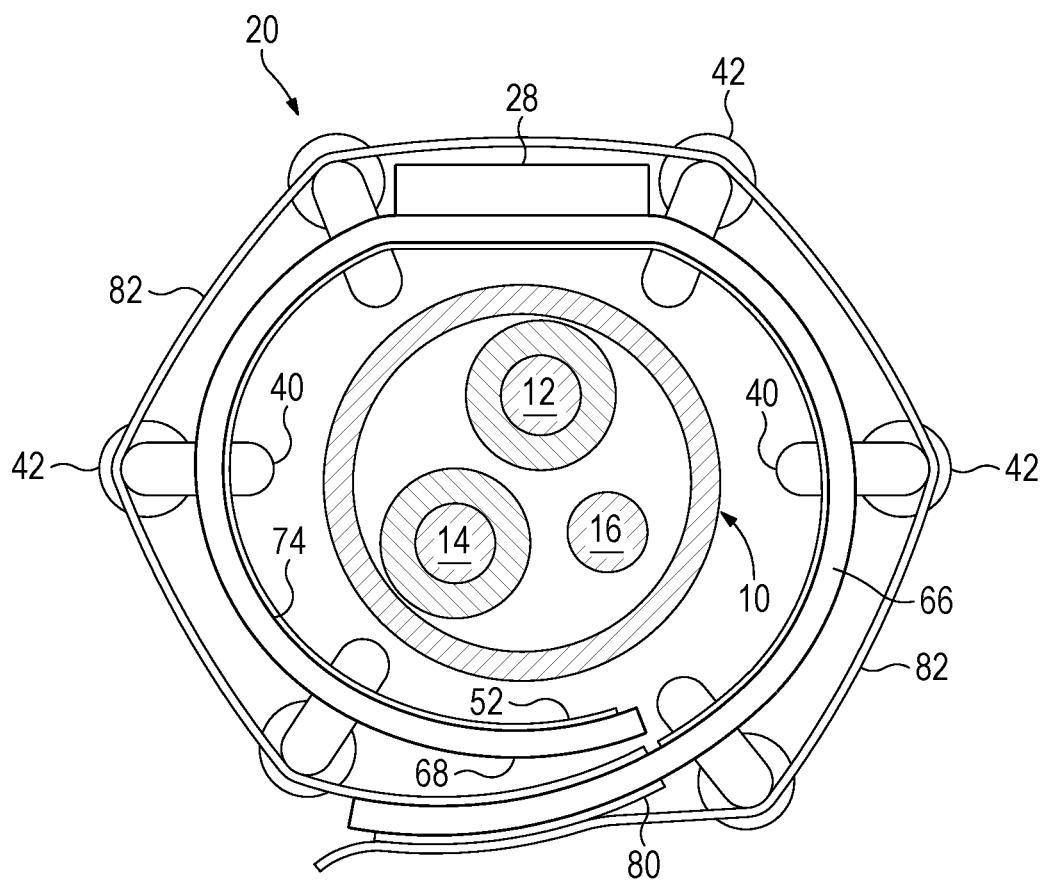
FIG. 9 is a sectional view, taken on line 7-7 in FIG. 3A, at an enlarged scale, showing the voltage indicator in use, wrapped around a grounded power cord.

As may be seen in FIGS. 7, 8, and 9, the voltage indicator 20 or 60 is utilized by wrapping it around a power cable or cord 10 or 26, bending the flexible base member 66 and the flexible conductive cloth member 72 of the base capacitor plate 52 about an axis parallel with the length of the small wire capacitor plate 40 connected to the several diodes 42. With the flexible base member 66 wrapped around the power cord 18 or 26, the narrow strips 82 of loop pile-bearing fastener material are brought into contact with the small patches 80 of loop-pile fastener material to secure the voltage indicator 20 around the power cord in a configuration such as that shown in FIGS. 8 and 9, This results in the flexible conductive material 72 of the base capacitor plate 52 being wrapped around the entire power cord 10 with each of the small wire capacitor plates 40 connected to the individual diodes 42 extending along the power cord 10 parallel with the generally longitudinal extent of each of the conductors 12, 14, or 16 of the power cord 10. Although the conductors 12, 14, and 16 within the power cord 10 may be twisted helically, the extent of the length of each of the small wire capacitor plates 40 is within a detectable alternating magnetic field produced by alternating current voltage in the power cord 10 when the power cord 10 is energized, and the resulting charging and discharging of each of the capacitor plates 40 and 52 produces a current, rectified by the diodes 42, through the display device 28 sufficient to produce a visible display 20 on the display element 24, to indicate the presence of alternating current voltage in the power cord 10.

Capacitors pass AC while blocking DC, Thus, if the power cord 10 is energized, the liquid crystal display 24 is energized by the voltage developed in the capacitor plate2 40 and 52 and allowed to pass through the diodes 42. If the power cord 10 is not energized, the display element 24 remains off when the voltage indicator 20 is in place around the power cord. Since the voltage indicator 20 is sensitive to alternating voltage in the power cord 10 at any location along the power cord, the voltage indicator 20 may be placed on the power cord at any convenient location where the display element 24 can easily be viewed.

A substantial advantage of the present voltage indicator 20 or 60 is that it doesn't require a battery or other external power source as so many other types of voltage indicators do.

From the foregoing description it will be clear that the voltage indicators 10 and 60 disclosed herein provide convenient and inherently simple apparatus and a method for determining whether AC voltage is present in a power cord in connection with which the voltage indicator is used.

For convenience, the reference numerals used in the drawings are listed herebelow:
- 10—grounded power cord
- 12—hot conductor of power cord
- 14—neutral conductor of power cord
- 16—grounded conductor of power cord
- 18—power source
- 20—voltage indicator
- 22—bars
- 24—display element
- 26—two conductor power cord
- 28—display device
- 30—extension cord
- 32—lamp
- 34—soldering iron
- 36—power cable
- 38—wall
- 40—capacitor plates
- 42—diodes
- 44—display device input conductor
- 46—first display input electrode
- 52—base capacitor plate
- 54—conductor
- 56—second display input electrode
- 60—voltage indicator
- 62—diodes
- 66—flexible base
- 68—first, outer, main side of flexible face
- 72—flexible conductive sheet
- 74—second, inner, main side of flexible face
- 80—hook material
- 82—narrow strip of pile material
- 84—conductive cloth The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An optionally attachable and detachable voltage indicator, comprising:
    a flexible base of electrically non-conductive sheet material, the flexible base having first and second opposite main sides;
    a display device attached to the flexible base on the first main side thereof and having at least a first display input electrode and a second display input electrode;
    a first flexible capacitor plate member, said first flexible capacitor plate member being attached to the second main side of the flexible base and being electrically connected to said first display input electrode of said display device;
    a diode having a first terminal that is connected electrically to said second display input electrode of said display device; and
    a second conductive capacitor plate element that is connected to an opposite second terminal of the diode; and wherein
    the voltage indicator can be coupled capacitively and parasitically with electrical conductors of an electrical power cord on which alternating current voltage is present and on which the voltage indicator is mounted, so as to deliver current through the diode to the display device, and whereby the presence or absence of alternating current voltage between a pair of separate conductors of the power cord is indicated by a change in the appearance of said display device.

2. The voltage indicator of claim 1 wherein the said display device is a liquid crystal display with an operating voltage requirement of not more than 1.0 volt.

3. The voltage indicator of claim 1 including a releasable fastener secured to the flexible base and arranged to hold the flexible base selectively in a configuration in which the flexible base of the voltage indicator is wrapped around the power cord.

4. The voltage indicator of claim 3 wherein the fastener comprises a hook-and-loop fastener arrangement including an area of a first component attached to the first main side of the flexible base and a flexible strap of a cooperative second component attached to the flexible base at a separate location thereon.

5. The voltage indicator of claim 1, wherein the first flexible capacitor plate member comprises an electrically conductive fabric mounted on the second main side of the flexible base.

6. A method of detecting and indicating the presence of an alternating current line voltage on a power cord including an insulated hot conductor, said method comprising:
    providing an AC voltage indicator device including a flexible base of electrically non-conductive sheet material, the flexible base having first and second opposite main sides;
    a display device attached to the flexible base on the first main side thereof and having at least a first display input electrode and a second display input electrode;
    a first flexible capacitor plate member said first flexible capacitor plate member being attached the second main side of to the flexible base and being electrically connected to said first display input electrode of said display device;
    a diode having a first terminal that is connected electrically to said second display input electrode of said display device; and
    a second conductive capacitor plate element that is connected to an opposite second terminal of the diode; and wrapping the flexible base around the power cord with the second main side inward, toward the power cord, and the first main side outward, thereby coupling the voltage indicator capacitively and parasitically with an alternating current voltage that may be present in the power cord, so as to deliver current from the diode to the display device, in a position on the power cord where the display device is visible to a person desiring to know whether such voltage is present; and determining the presence or absence of such voltage in the power cord by observing the appearance of said display device.

7. The method of claim 6 wherein the said display device is a liquid crystal display with an operating voltage requirement of not more than 2.0 volts.

8. The method of claim 6 including fastening the voltage indicator to the power cord using hook-and-loop fastener arrangement including an area of a first component attached to the first main side of the flexible base and a flexible strap of a cooperative second component attached to the flexible base at a separate location thereon.

9. The method of claim 6, wherein the first flexible capacitor plate member comprises an electrically conductive fabric mounted on the second main side of the flexible base.

* * * * *